(12) United States Patent
Lakdawala et al.

(10) Patent No.: US 7,576,621 B2
(45) Date of Patent: Aug. 18, 2009

(54) FILM BULK ACOUSTIC RESONATOR CALIBRATION

(75) Inventors: Hasnain Lakdawala, Beaverton, OR (US); Ofir Degani, Haifa (IL); Ashoke Ravi, Hillsboro, OR (US); Masoud Sajadieh, Beaverton, OR (US); Soumyanath Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 158 days.

(21) Appl. No.: 11/823,856

(22) Filed: Jun. 28, 2007

(65) Prior Publication Data
US 2009/0002086 A1 Jan. 1, 2009

(51) Int. Cl.
*H03L 1/00* (2006.01)
(52) U.S. Cl. .................. 331/176; 455/76; 455/260; 375/376

(58) Field of Classification Search .............. 331/14, 331/23, 176; 455/260, 76, 113; 375/376; 377/48
See application file for complete search history.

(56) References Cited

U.S. PATENT DOCUMENTS 7,449,968 B1 * 11/2008 Cioffi et al. ............... 331/154

* cited by examiner

*Primary Examiner*—Daniel D Chang
(74) *Attorney, Agent, or Firm*—Dana B. Lemoine; Lemoine Patent Services, PLLC

(57) ABSTRACT

Film bulk acoustic resonators (FBARS) have resonant frequencies that vary with manufacturing variations, but tend to be matched when in proximity on an integrated circuit die. FBAR resonant frequency is determined using a fractional-N synthesizer and comparing phase/frequency of an output signal from the fractional-N synthesizer to a reference. The reference may be derived from a low frequency crystal oscillator, an external signal source, or a communications signal.

10 Claims, 4 Drawing Sheets

FILM BULK ACOUSTIC RESONATOR CALIBRATION

FIELD

The present invention relates generally to film bulk acoustic resonators, and more specifically to frequency calibration of film bulk acoustic resonators.

BACKGROUND

Film bulk acoustic resonators (FBARs) are devices that include a thin film piezoelectric material sandwiched between two electrodes and acoustically de-coupled from the surrounding medium. These devices can be made to be strongly resonant with narrow bandwidth at high frequencies (several gigahertz), consistent with wireless communication frequencies. Many applications exist for FBARs including filters, duplexers, etc.

The resonant frequency of an FBAR depends on many factors, including the deposition thickness of the thin film that makes up the resonator. This makes the resonant frequency of FBARs dependent on manufacturing variations. FBARs on the same integrated circuit (and in the same locale on the same integrated circuit) may be well matched because of the locality of deposition methods, but absolute resonant frequency values tend to vary from chip to chip and/or batch to batch.

DESCRIPTION OF EMBODIMENTS

Figure 1:
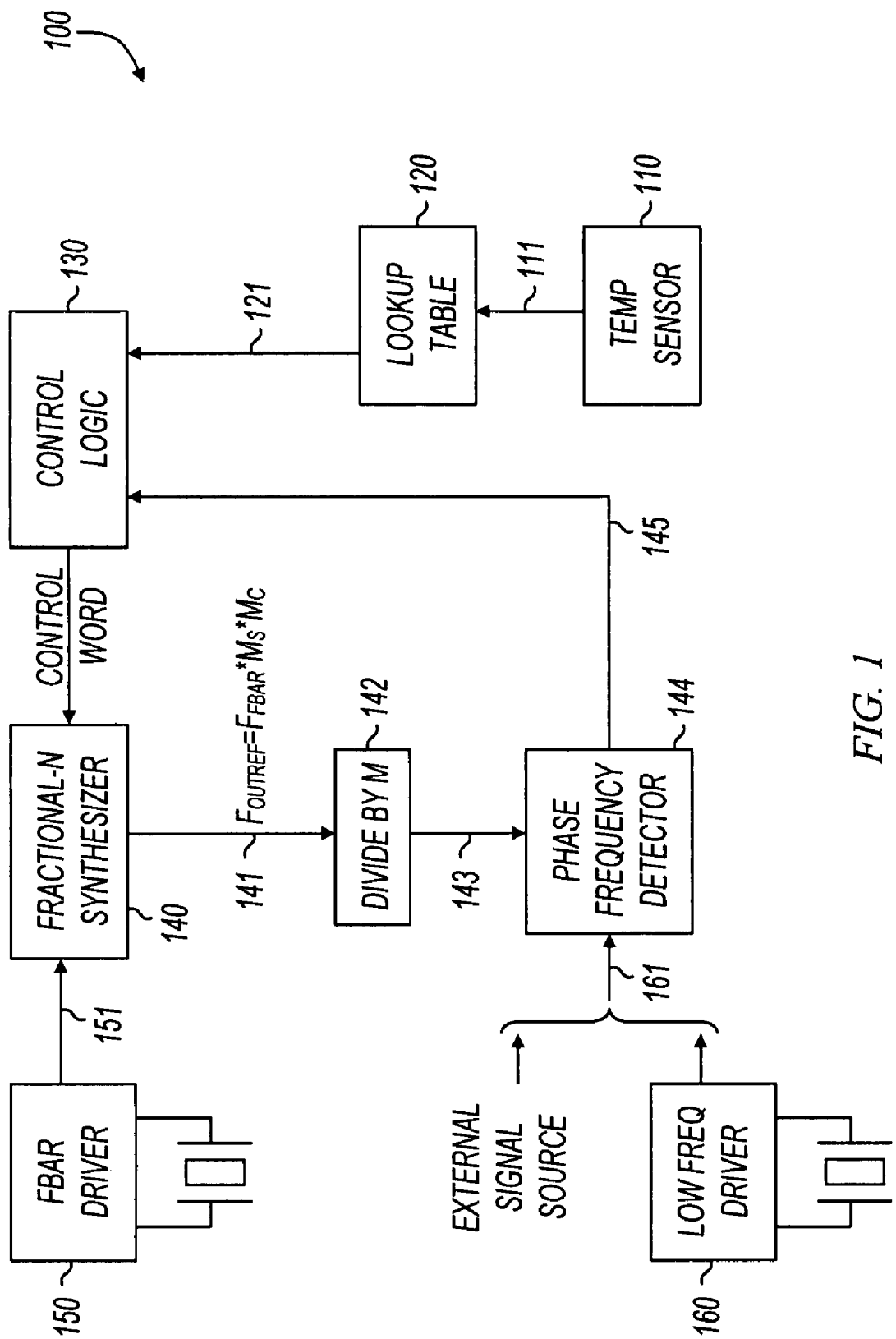
FIG. 1 shows a system capable of calibrating a film bulk acoustic resonator using an external signal source.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a system capable of calibrating a film bulk acoustic resonator using an external signal source. System 100 includes film bulk acoustic resonator (FBAR) driver 150, fractional-N frequency synthesizer 140, divide by M circuit 142, phase/frequency detector 144, temperature sensor 110, lookup table 120, and control logic 130. System 100 may also include low frequency driver 160.

System 100 may be used to calibrate the natural frequency of the film bulk acoustic resonator(s) within FBAR driver 150. Film bulk acoustic resonators have a thin film that can be made to have a narrow bandwidth resonant frequency at high frequencies (many gigahertz). This makes FBARs useful in many communications circuits, such as intermediate frequency (IF) filters made up of multiple FBARs connected in half ladder, full ladder, lattice, or stacked filter topologies. Many other FBAR applications also exist.

FBARs tend to be closely matched on a single integrated circuit die, but absolute resonant frequency values may vary based on manufacturing tolerances. For example, in some embodiments, resonant frequency values may vary about 1000 parts per million (ppm). The various embodiments of the present invention determine the resonant frequency of at least one FBAR on a die. Other FBAR devices on the die may be used in many of the aforementioned applications with the knowledge of their resonant frequency.

In operation, FBAR driver 150 provides a narrow bandwidth signal centered at the resonant frequency ($F_{FBAR}$) of the FBAR(s) within FBAR driver 150. This signal is provided to fractional-N synthesizer 140 on node 151. Fractional-N frequency synthesizers are known, and any type of fractional-N synthesizer may be used. In the embodiments represented by FIG. 1, the nominal frequency multiplier of synthesizer 140 is given by $M_S$. Further, the control word provided by control logic 130 provides an additional frequency multiplication factor of $M_C$. Accordingly, the output reference frequency ($F_{OUTREF}$) provided by fractional-N synthesizer 140 on node 141 is given by $$F_{OUTREF} = F_{FBAR} * M_S * M_C \quad (1)$$

The output reference frequency $F_{OUTREF}$ is divided by M by circuit 142, and the result is provided to phase/frequency detector 144 on node 143. Phase/frequency detector 144 also receives a low frequency reference signal on node 161. Phase/frequency detector 144 measures a difference in phase or frequency between the two signals, and provides an error indication to control logic 130 on node 145. In response to the error indication on node 145, control logic 130 modifies the control word to fractional-N synthesizer 140 to drive the error indication to zero.

For a reference signal ($F_{REF}$) on node 161, $$F_{OUTREF} = F_{REF} * M \quad (2)$$

and the resonant frequency of the FBAR can be found as $$F_{FBAR} = M * F_{REF} / M_C / M_S \quad (3)$$

In general, any signal source having a known frequency may be utilized to source the signal on node 161. For example, a low frequency driver 160 on the same integrated circuit may be used. In some embodiments, low frequency driver 160 includes a high-Q surface acoustic wave (SAW) filter having a known center frequency. Also for example, an external signal source may be utilized to source $F_{REF}$ on node 161.

System 100 also includes a temperature compensation circuit. The center frequency of the FBAR may change as a function of temperature, and the temperature compensation circuit compensates for this change. In operation, temperature sensor 110 senses the temperature of the integrated circuit near the FBAR. Temperature sensor 110 sources a digital word representing temperature to lookup table 120 on node 111. In response to the digital word on node 111, lookup table 120 provides a compensation value to control logic 130, which creates the fractional-N synthesizer control word ($M_C$) in response to both the error indication on node 145 and the temperature compensation value on node 121.

The lookup table 120 may be populated with values as $F_{OUTREF}$ changes as a function of temperature while control logic 130 holds the control word constant. Additional circuitry (not shown) may be utilized to write to the lookup table. The lookup table may also implemented by a mathematical equation relating the measured temperature to the control logic input.

Figure 2:
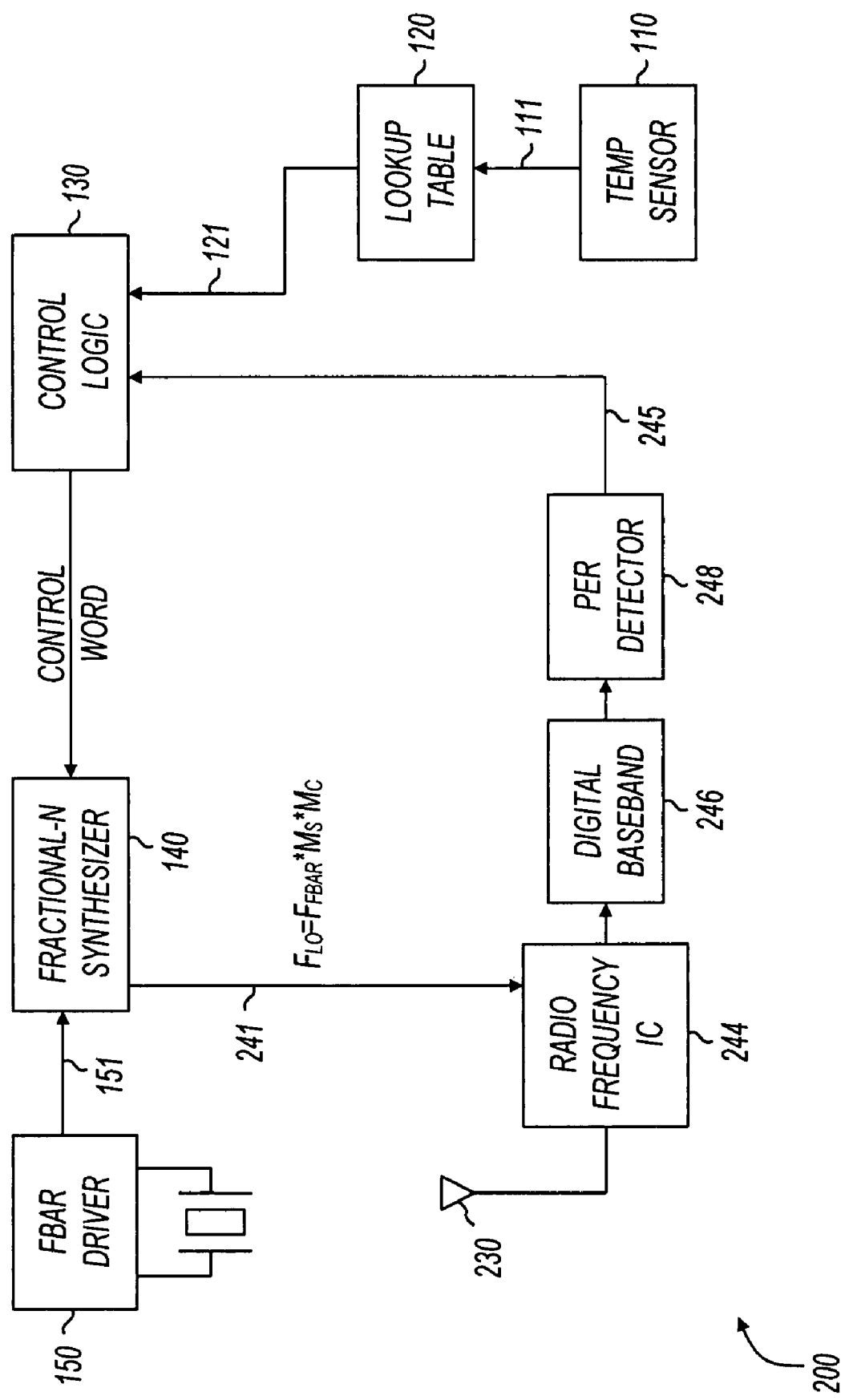
FIG. 2 shows a system capable of calibrating a film bulk acoustic resonator using packet detection.

FIG. 2 shows a system capable of calibrating a film bulk acoustic resonator using packet detection. System 200 includes FBAR driver 150, fractional-N synthesizer 140, control logic 130, temperature sensor 110, and lookup table 120, all of which are described above with reference to FIG. 1. System 200 also includes radio frequency integrated circuit (IC) 244, antenna 230, digital baseband circuits 246, and packet error rate (PER) detector 248.

In operation, fractional-N synthesizer 140 sources a reference frequency signal that is a function of the FBAR resonant frequency ($F_{FBAR}$), the nominal synthesizer multiple ($M_S$), and the control word multiple ($M_C$). In embodiments represented by FIG. 2, this reference frequency signal is used as a local oscillator signal having frequency $F_{LO}$ for radio frequency IC 244.

Radio frequency IC 244 receives radio signals at antenna 230 and downconverts them to an intermediate frequency or to a baseband frequency using the local oscillator signal on node 241. Digital baseband circuits 246 provide further processing, and produce digital data represented by the received signals that are downconverted using the local oscillator signal. In some embodiments, the data is organized in packets. Packet error rate (PER) detector 248 detects errors in received packets. Errors may be caused by many factors including a frequency offset in the local oscillator signal.

In response to packet errors, PER detector 248 provides an error indication to control logic 130 on node 245. In response, control logic 130 modifies the control word provided to fractional-N synthesizer 140, to reduce packet errors caused by frequency offsets in the local oscillator signals. When the loop settles to a steady state, the FBAR frequency may be calculated as $$F_{FBAR}=F_{LO}/M_C/M_S \qquad (4)$$

where $F_{LO}$, $M_C$, and $M_S$ are known. $M_C$ is known from the control logic, $M_S$ is known from the design of the fractional-N synthesizer, and $F_{LO}$ is known from the communications environment. For example, if the center frequency of the communications signal is known, then the LO frequency needed to downconvert with minimal errors is also known.

In some embodiments, system 200 is a radio receiver that may operate in a wireless network. For example, system 200 may be a radio compliant with IEEE 802.11 1999 edition, or any other wireless standard.

Figure 3:
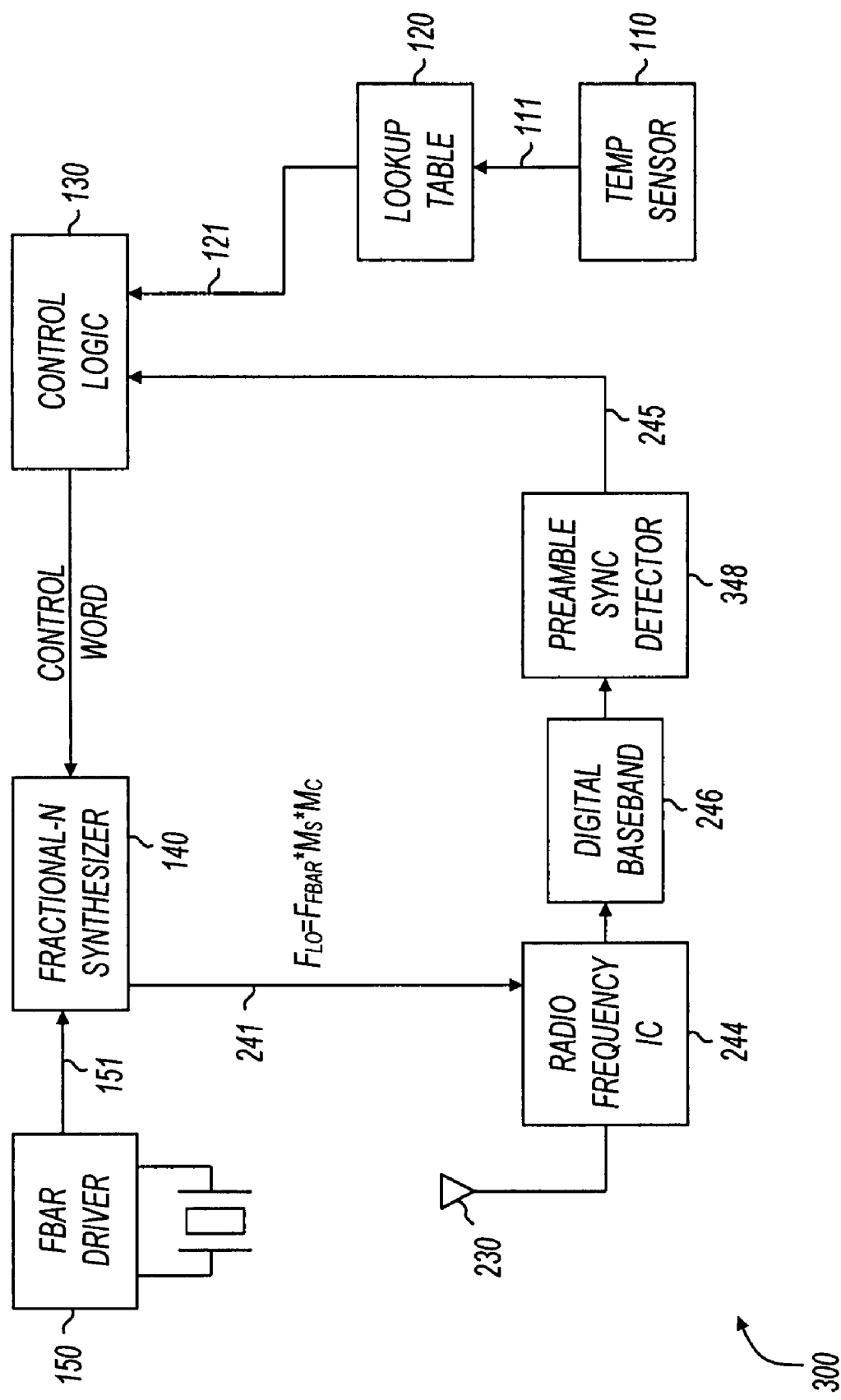
FIG. 3 shows a system capable of calibrating a film bulk acoustic resonator using receiver phase error measurements.

FIG. 3 shows a system capable of calibrating a film bulk acoustic resonator using receiver phase error measurements. System 300 includes many of the same components as 200 (FIG. 2), however, system 300 includes preamble sync detector 348. In some embodiments, preamble sync detector 348 performs phase error measurements from the preamble of the synchronization sequence of IEEE 802.11 compatible packets. Future standards may incorporate other frequency offset detection techniques in the packet header information. Preamble sync detector 348 may perform these measurements for every received packet, and provide error information to control logic 130. In some embodiments, control logic 130 updates the control word between received packets using temperature information received from lookup table 120.

Figure 4:
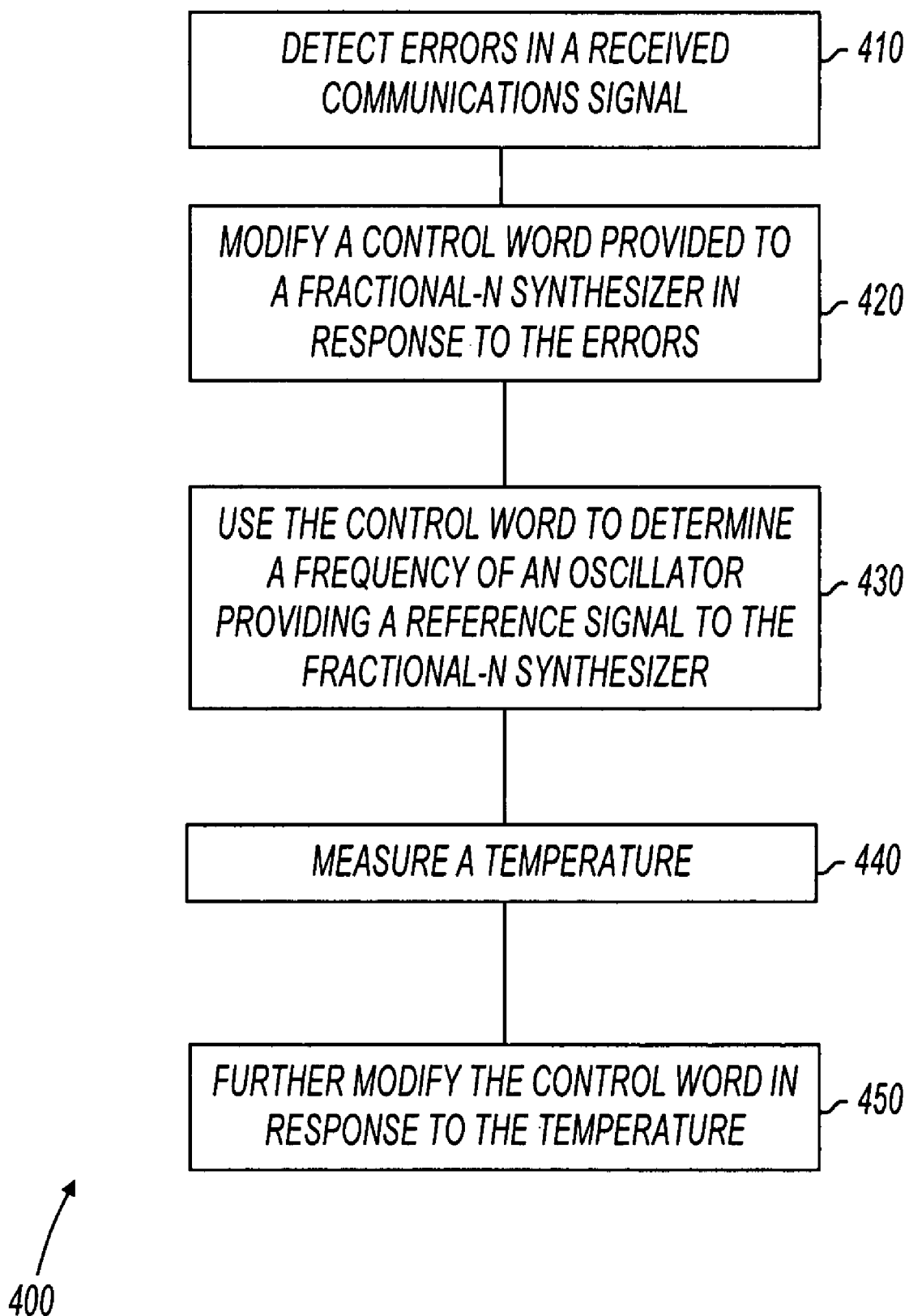
FIG. 4 shows a flowchart in accordance with various embodiments of the present invention.

FIG. 4 shows a flowchart in accordance with various embodiments of the present invention. In some embodiments, method 400, or portions thereof, is performed by an integrated circuit that includes a film bulk acoustic resonator and a fractional-N synthesizer. In other embodiments, method 400 is performed by a IEEE 802.11 compatible radio or an electronic system. Method 400 is not limited by the particular type of apparatus performing the method. The various actions in method 400 may be performed in the order presented, or may be performed in a different order. Further, in some embodiments, some actions listed in FIG. 4 are omitted from method 400.

Method 400 is shown beginning with block 410 in which errors are detected in a communications signal. In some embodiments, these errors may be a result of frequency error in a local oscillator signal. For example, errors may result from frequency drift in the local oscillator signal on node 241 (FIGS. 2, 3). Errors may be detected in many ways. For example, packet errors may be detected or phase errors may be measured from a preamble synchronization sequence.

At 420, a control word provided to a fractional-N synthesizer is modified in response to the errors. In some embodiments, this may correspond to control logic 130 modifying the control word to synthesizer 140 (FIGS. 1-3). In some embodiments, the actions of 410 and 420 are repeated until errors are reduced or driven to near zero. When this occurs, the fractional-N synthesizer has corrected any frequency error in the local oscillator signal.

At 430, the control word is used to determine a frequency of an oscillator providing a reference signal to the fractional-N synthesizer. For example, a resonant frequency of a film bulk acoustic resonator may be determined using equation 3 or equation 4, above. In some embodiments, the resonant frequency may be utilized to calibrate additional FBAR resonators on a common integrated circuit die. For example, an RF/IF filter may be calibrated.

At 440, a temperature is measured, and at 450, the control word is further modified in response to the temperature. In some embodiments, compensation for temperature is performed between times when compensation for local oscillator frequency is performed. For example, the control word may be updated as a function of temperature between times that errors are detected.

In some embodiments, a lookup table is used to map temperature to frequency offset (control word). Method 400 may include an additional calibration procedure to populate the lookup table with values that map temperature to frequency offset.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
    a high frequency signal source;
    a fractional N synthesizer coupled to receive a signal from the high frequency signal source, the fractional N synthesizer further coupled to receive a digital control word and output a local oscillator signal;
    a radio receiver circuit coupled to the fractional N synthesizer to receive the local oscillator signal and to provide data packets; and an error indication circuit coupled to the radio receiver circuit to detect errors, and to provide the digital control word to the fractional N synthesizer.

2. The apparatus of claim 1 wherein the high frequency signal source comprises a field bulk acoustic resonator.

3. The apparatus of claim 1 wherein the error indication circuit comprises a packet error detector to detect errors in received data packets.

4. The apparatus of claim 1 wherein the error indication circuit comprises a preamble sync detector.

5. The apparatus of claim 1 wherein the radio receiver circuit comprises an IEEE 802.11 compatible radio, and the error indication circuit is responsive to phase error measurements computed from a preamble of a synchronization sequence.

6. The apparatus of claim 1 further comprising:
a temperature sensor; and
a lookup table coupled to receive a temperature word from the temperature sensor, and to influence the digital control word.

7. A method comprising:
detecting errors in a received communications signal; and
modifying a control word provided to a fractional N synthesizer to modify a local oscillator signal frequency to reduce the errors;
wherein detecting errors comprises detecting errors in a received preamble sync string.

8. A method comprising:
detecting errors in a received communications signal; and modifying a control word provided to a fractional N synthesizer to modify a local oscillator signal frequency to reduce the errors;
wherein detecting errors comprises detecting errors in received data packets.

9. A method comprising:
detecting errors in a received communications signal;
modifying a control word provided to a fractional N synthesizer to modify a local oscillator signal frequency to reduce the errors;
using the control word to determine a frequency of an oscillator providing a reference signal to the fractional N synthesizer; and
using the frequency of the oscillator to calibrate a second oscillator on a common integrated circuit die with the oscillator providing the reference signal to the fractional N synthesizer.

10. A method comprising:
detecting errors in a received communications signal;
modifying a control word provided to a fractional N synthesizer to modify a local oscillator signal frequency to reduce the errors;
measuring a temperature; and
further modifying the control word in response to the temperature;
wherein further modifying the control word comprises indexing into a lookup table with a data word representing the temperature.

* * * * *